United States Patent [19]
Huang et al.

[11] Patent Number: 5,719,088
[45] Date of Patent: Feb. 17, 1998

[54] METHOD OF FABRICATING SEMICONDUCTOR DEVICES WITH A PASSIVATED SURFACE

[75] Inventors: Jenn-Hwa Huang, Gilbert; Mark Durlam, Chandler; Marino J. Martinez; Ernie Schirmann, both of Phoenix; Saied N. Tehrani, Tempe; William J. Ooms, Chandler, all of Ariz.

[73] Assignee: Motorola, Inc., Schaumburg, Ill.

[21] Appl. No.: 556,477

[22] Filed: Nov. 13, 1995

[51] Int. Cl.⁶ .................................. H01L 21/44
[52] U.S. Cl. ............... 438/637; 438/739; 438/606; 438/167
[58] Field of Search ................. 437/195, 612, 437/184, 978; 156/662.1; 438/637, 621, 701, 733, 739, 933, 606, 167

[56] References Cited

U.S. PATENT DOCUMENTS 5,389,574  2/1995  Mizunuma .................... 437/184

OTHER PUBLICATIONS

W.C. Simpson, et al. "Soft X-ray photoelectron spectroscopy study of the reaction of XeF$_2$ with GaAs" J.Vac. Sci. Technol. A 13(3) (May 1 Jun. 1995) pp. 1709–1713.

Primary Examiner—John Niebling
Assistant Examiner—C. Everhart
Attorney, Agent, or Firm—Eugene A. Parsons

[57] ABSTRACT

A method of fabricating semiconductor devices with a passivated surface includes providing a contact layer on a substrate so as to define an inter-electrode surface area. A first layer and an insulating layer, which are selectively etchable relative to each other and to the substrate and the contact layer, are deposited on the contact layer and the inter-electrode surface area. The insulating layer and the first layer are individually and selectively etched to define an electrode contact area and to expose the inter-electrode surface area. The exposed inter-electrode surface area is passivated, either subsequent to or during the etching of the first layer. A metal contact is formed in the electrode contact area in abutting engagement with the insulating layer so as to seal the inter-electrode surface area.

18 Claims, 1 Drawing Sheet

METHOD OF FABRICATING SEMICONDUCTOR DEVICES WITH A PASSIVATED SURFACE

FIELD OF THE INVENTION

The present invention pertains to the fabrication of semiconductor devices and more specifically to passivation of certain surfaces of the semiconductor devices during the fabrication process.

BACKGROUND OF THE INVENTION

Compound semiconductor devices, such as FETs, HBTs, lasers, etc., need a properly passivated surface between electrodes for consistent device operation, improved device characteristics, and better reliability.

In GaAs MESFETs, for example, the gate-drain breakdown voltage is one of the most important factors limiting the maximum output power of the MESFET. Many prior methods to increase the breakdown voltage, such as a double gate recess and increased gate-drain spacing, are often accompanied by lower RF gain and/or drain saturation current. Attempts to increase the gate-drain breakdown voltage by placing an insulator between the gate metal and the MESFET channel usually introduce undesirable interface states.

Recently, GaAs MESFETs with a low interface-state density were realized using a high-resistivity low-temperature-grown GaAs layer as the gate insulator. In a conventional gate MESFET, the high-resistivity low-temperature-grown GaAs layer is deposited and then etched to allow the deposition of source, drain and gate metal contacts. The major problem with this method is that a gap remains between the sides of the metal contacts and the high-resistivity low-temperature-grown GaAs layer, which substantially reduces the breakdown voltage of the MESFET. A typical example of such structures is disclosed in U.S. Pat. No. 5,041,393, entitled "Fabrication of GaAs Integrated Circuits" and issued Aug. 20, 1991.

In an attempt to solve this problem in the prior art, the gate metal was deposited so as to overlap the high-resistivity low-temperature-grown GaAs layer. However, the overlap gate process is difficult and complicated and requires a critical alignment and wet etching process and is not, therefore, easily manufacturable, especially for sub-micron gate dimensions.

It would be advantageous to have a fabrication method in which interelectrode areas of compound semiconductor devices are passivated so as to provide consistent device operation, improved device characteristics, and better reliability.

It is a purpose of the present invention to provide a new and improved method of fabricating semiconductor devices with a passivated surface area.

It is another purpose of the present invention to provide a new and improved method of fabricating semiconductor devices with a passivated surface area while providing consistent device operation, improved device characteristics, and better reliability.

It is still another purpose of the present invention to provide a new and improved method of fabricating semiconductor devices with a passivated surface area which is relatively easy and accurate to perform.

It is a further purpose of the present invention to provide a new and improved method of fabricating semiconductor devices with a passivated surface area which substantially improves breakdown characteristics of the device.

SUMMARY OF THE INVENTION

The above problems and others are at least partially solved and the above purposes and others are realized in a method of fabricating semiconductor devices with a passivated surface including the steps of providing a substrate with a contact layer of material disposed on a surface thereof and defining an inter-electrode surface area for a semiconductor device, positioning a first layer of material on the contact layer and the inter-electrode surface area, the first layer being selectively etchable relative to the substrate and the contact layer, positioning an insulating layer of material on the first layer in overlying relationship to the interelectrode surface area, the insulating layer being selectively etchable relative to the first layer, positioning a patterned layer of material on the insulating layer, the patterned layer having an opening therethrough defining an electrode contact area on the insulating layer, selectively etching the insulating layer in the electrode contact area to define the electrode contact area on the first layer, selectively etching the first layer in the electrode contact area and the inter-electrode area to expose the inter-electrode surface area and passivating the exposed inter-electrode surface area, and positioning a metal contact in the electrode contact area in abutting engagement with the insulating layer so as to seal the inter-electrode surface area.

BRIEF DESCRIPTION OF THE DRAWINGS

Referring to the drawings.

DESCRIPTION OF THE PREFERRED EMBODIMENTS

Figure 1:
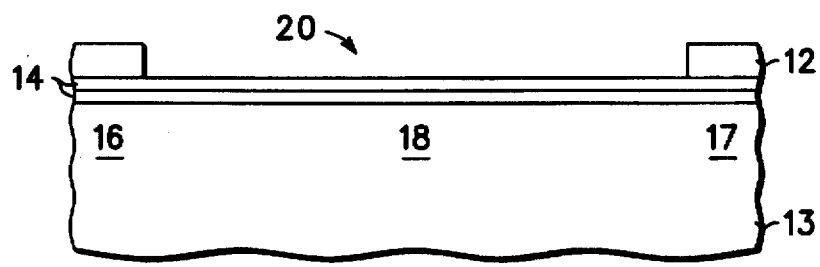
FIG. 1 is a simplified cross-sectional view of a substrate provided for use in a method in accordance with the present invention.

Referring specifically to FIG. 1, a simplified cross-sectional view of a substrate 10 is illustrated, having a contact layer 12 formed on an upper surface thereof. Substrate 10 may include one or more layers formed thereon by any convenient means, such as epitaxial growth or the like. As an example, substrate 10, in this embodiment, includes a supporting substrate 13 having a plurality of epitaxial layers 14 formed thereon. Epitaxial layers 14 are formed, for example, to provide an HFET with a source 16, a drain 17, and a gate area 18. It will be understood by those skilled in the art that other types of semiconductor devices, including various FETs, HBTs, and lasers, can be formed in, on, or as a part of a supporting substrate and are intended to be included in the definition of substrate 10.

Contact layer 12 is generally a heavily doped epitaxial layer grown on the surface of the device, or substrate 10, for purposes of making good electrical contact with source 16 and drain 17, while defining an inter-electrode area 20 generally above gate area 18. Contact layer 12 can be a heavily doped area in the upper surface of substrate 10, but is described herein as a separate layer for ease of description and understanding. Also, contact layer 12 can be any material which can be utilized to form good ohmic contacts between source 16, drain 17 and external metal terminals. In the present embodiment, contact layer 12 is formed of gallium arsenide (GaAs) heavily doped for N-type conduction. Also, supporting substrate 13 is formed of GaAs with epitaxial layers 14 crystallographically matched, so that layer 12 is compatible (i.e. generally crystalographically matched) with substrate 10.

Figure 2:
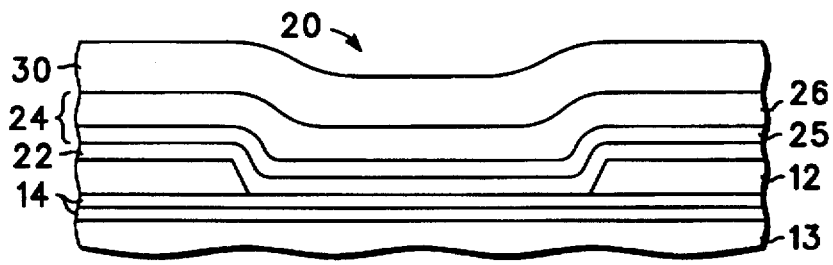
FIGS. 2 through 6 illustrate various steps of a method in accordance with the present invention, showing an enlarged portion of the substrate of FIG. 1.

Referring now to FIG. 2, a first layer 22 of material is positioned on the surface of substrate 10 and contact layer 12 generally as a blanket deposition, in this embodiment. While layer 22 is formed of insulating material, in this embodiment, it will be understood presently that it could be virtually any material that can be selectively etched and which is compatible with the surface of substrate 10. In this specific embodiment, layer 22 is formed of silicon nitride (SiN).

An insulating layer 24 is positioned in overlying relationship on layer 22 by any convenient means, such as a blanket deposition. As will be seen presently, layer 24 is in physical contact with various external metal terminals and, therefore, is preferably formed of some convenient insulating material. Also, layer 24 may be the final covering which is utilized to hermetically seal the electronic device or circuit and, therefore, should be sufficiently thick to not only withstand and protect the device from subsequent fabrication operations (e.g. etching, metal deposition, etc.) but should also provide a hermetic seal. Further, insulating layer 24 should be selectively etchable. To this end, insulating layer 24 includes a first sub-layer 25 of insulating material on the surface of layer 22 and a thicker sub-layer 26 on sub-layer 25.

In this specific embodiment, sub-layer 25 is formed of aluminum nitride (AlN), and sub-layer 26 is silicon oxide ($SiO_2$). The AlN of sub-layer 25 operates as an etch stop for the $SiO_2$ of sub-layer 26 so that etching can be performed quickly and easily. Also, there is sufficient etch selectivity between the AlN of sub-layer 25 and the SiN of layer 22 so that sub-layer 25 can be quickly and easily etched with a minimum effect on layer 22. While the dielectric trilayer, $SiO_2$/AlN/SiN, is used in the present specific example, it will be understood by those skilled in the art that other combinations of materials can be provided which will perform the described functions.

Figure 3:
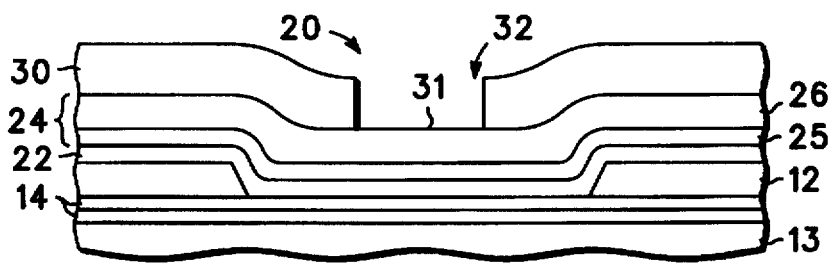

Referring now to FIG. 3, a patterned layer 30 of material is positioned on the surface of insulating layer 24 so as to define an electrode contact area 31 on the surface of insulating layer 24. In this specific example patterned layer 30 is photoresist which is deposited on insulating layer 24 in any of the well known methods. Further, patterned layer 30 has an opening 32 therethrough which defines electrode contact area 31 on the surface of insulating layer 24. Various techniques for patterning layer 30 to form opening 32 are known in the art and will not be elaborated upon in this disclosure.

Figure 4:
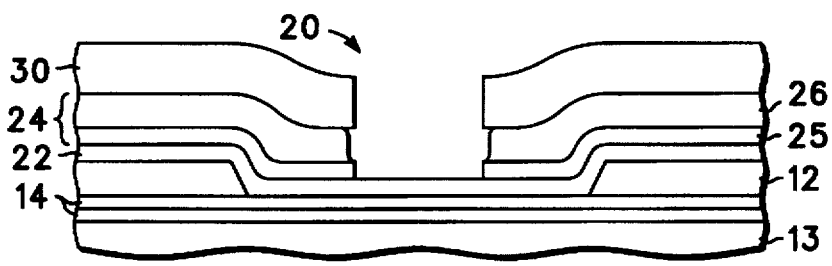

Utilizing patterned layer 30 as an etch mask, layer 26 is etched down to sub-layer 25, as illustrated in FIG. 4. In this etching step, the AlN of sub-layer 25 operates as an etch stop to ensure that the etching process stops at sub-layer 25, which simplifies the process and reduces the possibility of incidental damage. A second etch process is then utilized, with layer 26 operating as an etch mask, to form an opening through sub-layer 25, as illustrated in FIG. 4. Since sub-layer 25 and layer 22 are formed of material with etch selectivity, layer 22 operates as an etch stop for the etching of sub-layer 25 to ensure that the etching process stops at layer 22, which again simplifies the process and reduces the possibility of incidental damage. The opening through sub-layer 25 defines the electrode contact area on layer 22.

Figure 5:
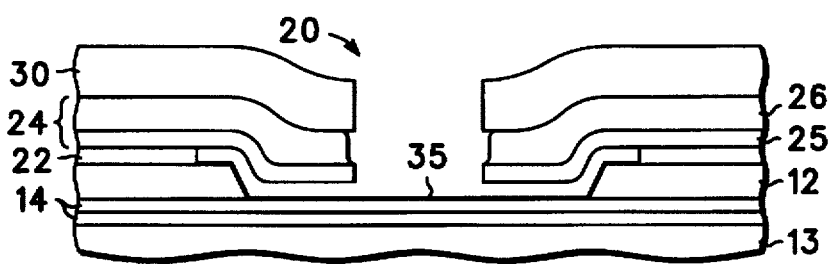

Referring now to FIG. 5, another etch process is performed to selectively etch layer 22 through the opening formed in sub-layer 25. Layer 22 is etched under layer 25 with sufficient undercut to expose inter-electrode area 20. Generally, inter-electrode area 20 includes electrode contact area 31 and an active channel region which surrounds electrode contact area 31. The undercut may be sufficient to expose a portion of contact layer 12, if desired, or may stop at the edge of contact layer 12.

Once layer 22 is etched to the desired undercut, the surface of substrate 10 in the inter-electrode area is treated to form a thin film 35 of passivating material. The passivating treatment is any fluid material that reacts with the material of substrate 10 (and contact layer 12 if desired) to form passivating film 35. Typically, the fluid material is a sulfide, fluoride, or oxide in gaseous form which reacts with substrate 10 to form a passivating film or surface, some specific examples of which are gallium sulfide (GaS), gallium fluoride ($GaF_3$), and ammonium sulfide ($(NH_4)_2S$).

In a different embodiment of the present invention, passivating film 35 is formed at the same time that layer 22 is etched. These steps are performed simultaneously by utilizing specific etchants, such as $NF_3$ or $XeF_6$ dry etches. The fluorine of the etchant reacts with the material of substrate 10, for example gallium, to form gallium fluoride ($GaF_3$).

Passivating film 35 provides consistent device operation, improved device characteristics, and better reliability than any of the previously used passivating dielectric layers which are deposited on the surface of the substrate so as to surround the electrode area. However, passivating film 35 generally is not stable against temperature and subsequent processing steps. Therefore, the present method is provided to not only form, but to preserve, passivating film 35 so as to take advantage of the improved device characteristics.

Figure 6:
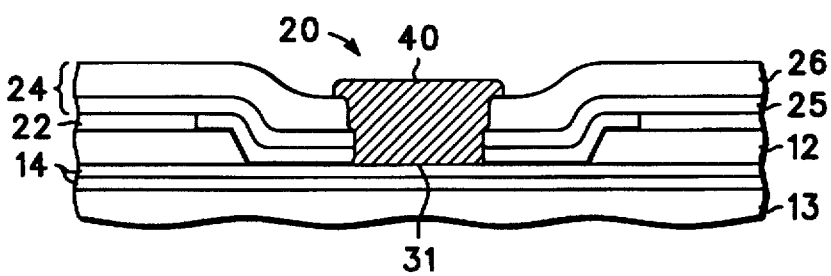

Referring now to FIG. 6, patterned layer 30 is removed from the device (or not removed, depending upon the metallization process used) and electrode metal 40 is deposited on electrode contact area 31 and within the openings through insulating layer 24 so as to abuttingly engage insulating layer 24 and seal inter-electrode surface area 20. In the present embodiment, for example, electrode contact area 31 is a gate contact area for an HFET and interelectrode area 20 is positioned between source 16 and drain 17, including the active channel region, (as illustrated in FIG. 1). Also, electrode metal 40 is gate metal and may be deposited utilizing any of the well known techniques, including metal evaporation, photo-patterning, and etch; or photo-patterning, metal evaporation and lift-off. In the latter procedure, the photo-patterning generally utilizes layer 30, which is already available.

The photoresist process and evaporation techniques (e.g. angle evaporation, etc.) may be optimized to ensure that metal 40 completely seals the opening through insulating layer 24. Generally, the various processes are performed in a vacuum and by sealing the opening through insulating layer 24, passivating film 35 is protected from the environment and from subsequent process steps. Additional process steps, such as forming external metal contacts for the source and drain, can now be performed without adversely effecting passivating film 35.

Thus, a new and improved method of fabricating semiconductor devices with a passivated surface area is disclosed. The new and improved method includes the formation of a passivating film which provides consistent device operation, improved device characteristics, and better reliability. Specifically, the new and improved method of fabricating semiconductor devices with a passivated surface area substantially improves breakdown characteristics of the device (e.g. gate-to-drain breakdown). Also, the new and improved method of fabricating semiconductor devices with a passivated surface area is relatively easy and accurate to perform.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating semiconductor devices with a passivated surface, the method comprising the steps of:

providing a substrate with a contact layer of material disposed on a surface thereof and defining an inter-electrode surface area for a semiconductor device;

positioning a first layer of material on the contact layer and the inter-electrode surface area, the first layer being selectively etchable relative to the substrate and the contact layer;

positioning an insulating layer of material on the first layer in overlying relationship to the interelectrode surface area, the insulating layer being selectively etchable relative to the first layer;

positioning a patterned layer of material on the insulating layer, the patterned layer having an opening therethrough defining an electrode contact area on the insulating layer;

selectively etching the insulating layer in the electrode contact area to define the electrode contact area on the first layer;

selectively etching the first layer in the electrode contact area and the inter-electrode area to expose the inter-electrode surface area and passivating the exposed inter-electrode surface area; and positioning a metal contact in the electrode contact area in abutting engagement with the insulating layer so as to cooperate with the insulating layer to hermetically seal the inter-electrode surface area.

2. A method of fabricating semiconductor devices with a passivated surface as claimed in claim 1 wherein the step of providing the substrate includes providing a supporting substrate including a plurality of epitaxial layers grown on a surface thereof and the contact layer includes a heavily doped epitaxial layer grown on the surface of the plurality of epitaxial layers.

3. A method of fabricating semiconductor devices with a passivated surface as claimed in claim 1 wherein the step of positioning the first layer of material on the contact layer and the interelectrode area includes depositing a layer of silicon nitride.

4. A method of fabricating semiconductor devices with a passivated surface as claimed in claim 3 wherein the step of positioning the insulating layer of material on the first layer includes depositing a layer of aluminum nitride.

5. A method of fabricating semiconductor devices with a passivated surface as claimed in claim 4 wherein the step of positioning the insulating layer of material on the first layer includes a step of forming the insulating layer of two different sub-layers of material.

6. A method of fabricating semiconductor devices with a passivated surface as claimed in claim 5 wherein the step of forming the insulating layer of two different sub-layers of material includes depositing a sub-layer of aluminum nitride on the layer of silicon nitride and depositing a sub-layer of silicon oxide on the layer of aluminum nitride.

7. A method of fabricating semiconductor devices with a passivated surface as claimed in claim 1 wherein the step of positioning the patterned layer of material on the insulating layer includes forming a layer of photoresist material on the insulating layer.

8. A method of fabricating semiconductor devices with a passivated surface as claimed in claim 1 wherein the step of selectively etching the first layer and passivating the exposed inter-electrode surface area includes utilizing an etchant which reacts with the exposed surface of the inter-electrode area to form a passivation film.

9. A method of fabricating semiconductor devices with a passivated surface as claimed in claim 1 wherein the step of selectively etching the first layer and passivating the exposed inter-electrode surface area includes the sub-step of selectively etching the first layer in the electrode contact area and the inter-electrode area to expose the inter-electrode surface area and the separate sub-step of passivating the exposed inter-electrode surface area subsequent to the sub-step of selectively etching the first layer.

10. A method of fabricating semiconductor devices with a passivated surface as claimed in claim 9 wherein the sub-step of passivating the exposed inter-electrode surface area includes treating the inter-electrode surface area with a fluid including one of an oxide, a fluoride or a nitride.

11. A method of fabricating semiconductor devices with a passivated surface as claimed in claim 1 including, subsequent to the step of positioning a metal contact in the electrode contact area, the step of forming additional external metal contacts for additional electrodes.

12. A method of fabricating semiconductor devices with a passivated surface, the method comprising the steps of:

providing a substrate including a supporting substrate with a plurality of epitaxial layers grown on a surface thereof and with a heavily doped epitaxial contact layer grown on the surface of the plurality of epitaxial layers and defining an inter-electrode surface area for a semiconductor device;

positioning a silicon nitride layer on the contact layer and the inter-electrode surface area, the silicon nitride layer being selectively etchable relative to the substrate and the contact layer;

positioning an insulating layer on the silicon nitride layer in overlying relationship to the interelectrode layer, the insulating layer including a sub-layer of aluminum nitride positioned on the layer of silicon nitride and a sub-layer of silicon oxide positioned on the sub-layer of aluminum nitride, the insulating layer being selectively etchable relative to the silicon nitride layer;

positioning a patterned layer of material on the insulating layer, the patterned layer having an opening therethrough defining an electrode contact area on the insulating layer;

selectively etching the insulating layer in the electrode contact area to define the electrode contact area on the silicon nitride layer;

selectively etching the silicon nitride layer in the electrode contact area and the inter-electrode area to expose the inter-electrode surface area and passivating the exposed inter-electrode surface area; and positioning a metal contact in the electrode contact area in abutting engagement with the insulating layer so as to seal the inter-electrode surface area.

13. A method of fabricating semiconductor devices with a passivated surface as claimed in claim 12 wherein the step of positioning the patterned layer of material on the insulating layer includes forming a layer of photoresist material on the insulating layer.

14. A method of fabricating semiconductor devices with a passivated surface as claimed in claim 12 wherein the step of selectively etching the silicon nitride layer and passivating the exposed inter-electrode surface area includes utilizing an etchant which reacts with the exposed surface of the inter-electrode area to form a passivation film.

15. A method of fabricating semiconductor devices with a passivated surface as claimed in claim 14 wherein the step of utilizing an etchant which reacts with the exposed surface of the inter-electrode area to form the passivation film includes utilizing one of $NF_3$ and $XeF_{6\ dry\ etch}$.

16. A method of fabricating semiconductor devices with a passivated surface as claimed in claim 12 wherein the step of selectively etching the silicon nitride layer and passivating the exposed inter-electrode surface area includes the sub-step of selectively etching the silicon nitride layer in the electrode contact area and the inter-electrode area to expose the inter-electrode surface area and the separate sub-step of passivating the exposed inter-electrode surface area subsequent to the sub-step of selectively etching the silicon nitride layer.

17. A method of fabricating semiconductor devices with a passivated surface as claimed in claim 15 wherein the sub-step of passivating the exposed inter-electrode surface area includes treating the inter-electrode surface area with a fluid including one of an oxide, a fluoride or a nitride.

18. A method of fabricating semiconductor devices with a passivated surface as claimed in claim 12 including, subsequent to the step of positioning a metal contact in the electrode contact area, the step of forming additional external metal contacts for additional electrodes.

\* \* \* \* \*